US010906248B2

(12) United States Patent
Kendrick et al.

(10) Patent No.: US 10,906,248 B2
(45) Date of Patent: Feb. 2, 2021

(54) ADDITIVE MANUFACTURING METHOD FOR IMPROVED CORE STRUCTURE

(71) Applicant: Textron Aviation Inc., Wichita, KS (US)

(72) Inventors: Phillip Anthony Kendrick, Wichita, KS (US); Lawrence Arthur Gintert, Andover, KS (US); Michael Preston McKown, Wichita, KS (US)

(73) Assignee: Textron Innovations, Inc., Providence, RI (US)

(*) Notice: Subject to any disclaimer, the term of this patent is extended or adjusted under 35 U.S.C. 154(b) by 298 days.

(21) Appl. No.: 15/847,087

(22) Filed: Dec. 19, 2017

(65) Prior Publication Data
US 2018/0169954 A1 Jun. 21, 2018

Related U.S. Application Data

(60) Provisional application No. 62/436,660, filed on Dec. 20, 2016.

(51) Int. Cl.
B29C 64/393 (2017.01)
B29C 64/40 (2017.01)
B33Y 50/02 (2015.01)
G06F 30/00 (2020.01)
(Continued)

(52) U.S. Cl.
CPC .......... B29C 64/393 (2017.08); B29C 64/40 (2017.08); B33Y 50/02 (2014.12); G06F 30/00 (2020.01); B33Y 10/00 (2014.12); B33Y 30/00 (2014.12)

(58) Field of Classification Search
CPC ........ B29C 64/393; B29C 64/40; B33Y 50/02
See application file for complete search history.

(56) References Cited

U.S. PATENT DOCUMENTS

2013/0313743 A1* 11/2013 Rockhold ............. B29C 64/106
264/40.1
2014/0257548 A1* 9/2014 Bachrach ........... G05B 19/4099
700/118
(Continued)

FOREIGN PATENT DOCUMENTS

WO 2016081496 A1 6/2016

Primary Examiner — Jacob T Minskey
Assistant Examiner — Melody Tsui
(74) Attorney, Agent, or Firm — Erise IP, P.A.

(57) ABSTRACT

An additive manufacturing method for improved core structure includes splitting a computational model into sequentially queued individual model segments based on a predetermined number of slices with a predetermined orientation, and building a part in layers applied sequentially to form a final part having a core portion supported with a custom in-fill pattern. An additive manufacturing system for providing an improved core structure supported by a custom in-fill pattern includes a controller having instructions for individual model segments based on slices of a solid model, and a 3D printer for sequentially printing individual model segments in adjacent layers. A 3D-printed part includes a first exterior surface separated by a gap from a second exterior surface, and an internal core structure within the gap for mechanically connecting the first exterior surface to the second exterior surface. The internal core structure includes a custom in-fill pattern of support members.

20 Claims, 6 Drawing Sheets

(51) Int. Cl.
*B33Y 30/00* (2015.01)
*B33Y 10/00* (2015.01)

(56) References Cited

U.S. PATENT DOCUMENTS

| | | | |
|---|---|---|---|
| 2016/0019319 A1* | 1/2016 | Shtilerman | G05B 19/4099 |
| | | | 264/308 |
| 2016/0159012 A1* | 6/2016 | Lee | G05B 19/41865 |
| | | | 700/98 |

* cited by examiner

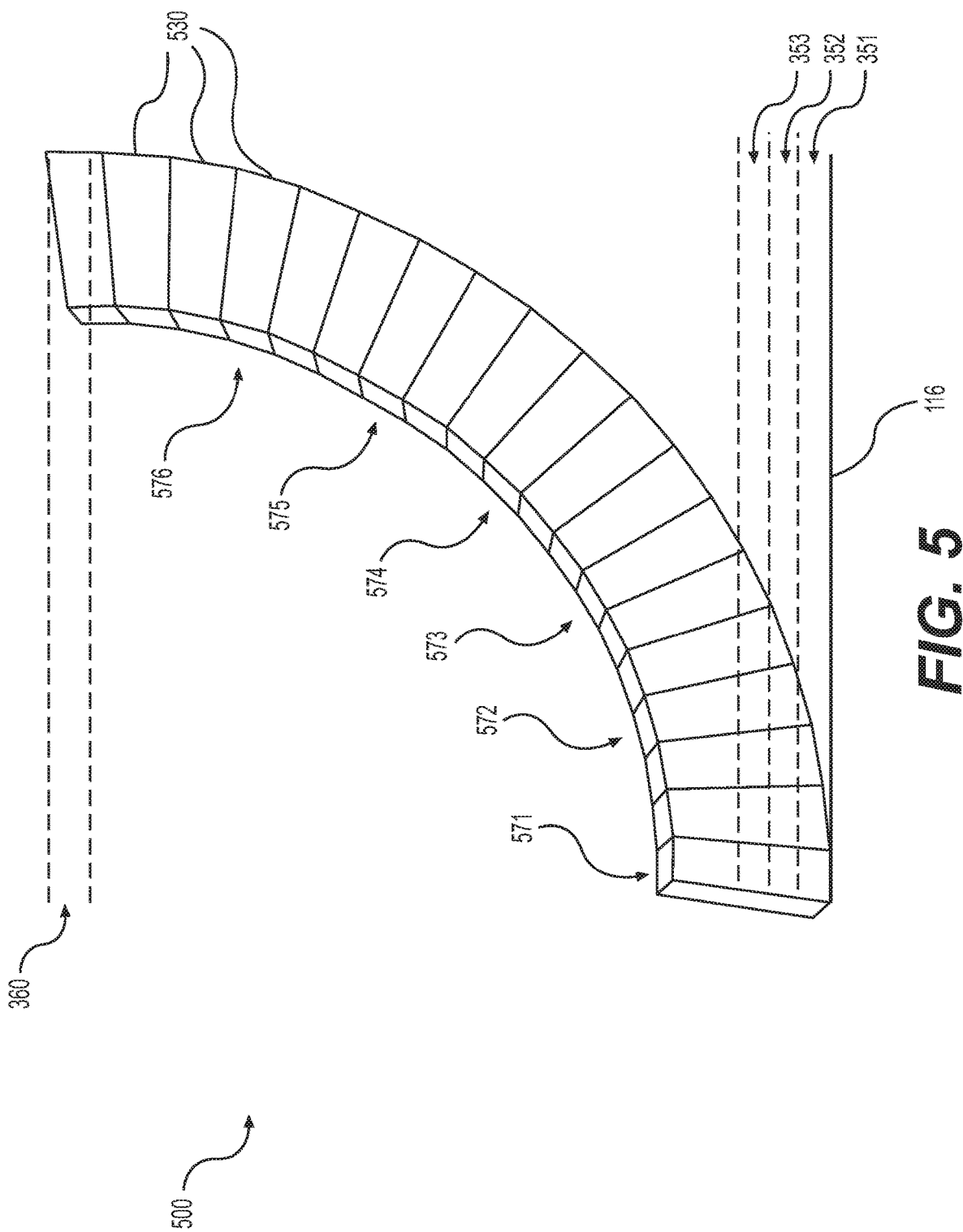

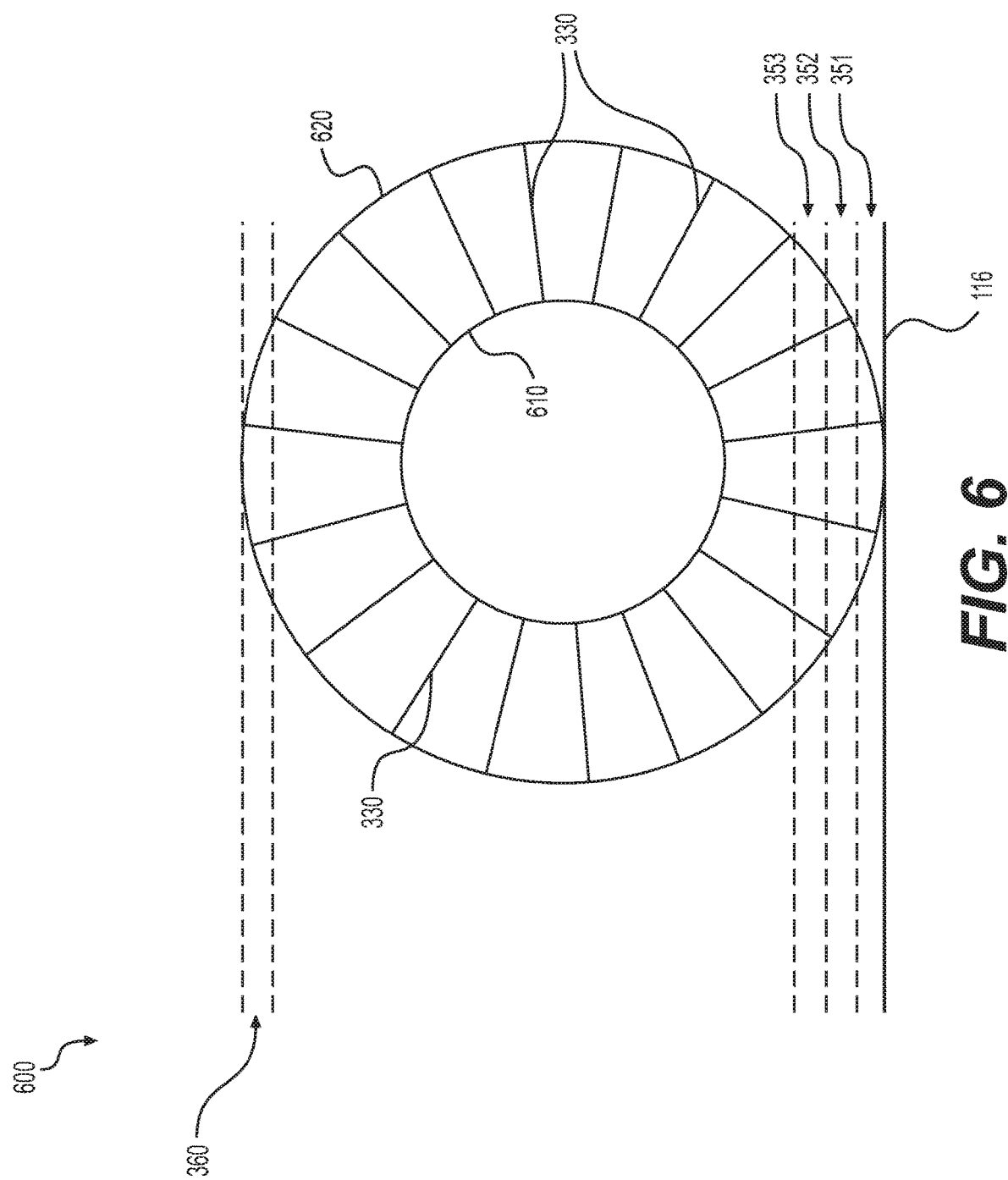

ADDITIVE MANUFACTURING METHOD FOR IMPROVED CORE STRUCTURE

CROSS-REFERENCE TO RELATED APPLICATIONS

This application claims the benefit of U.S. Provisional Patent Application Ser. No. 62/436,660 entitled Additive Manufacturing Method for Optimized Core Structure and filed Dec. 20, 2016, the disclosure of which is herein incorporated by reference in its entirety.

BACKGROUND

1. Field of the Disclosure

Embodiments of this disclosure relate generally to additive manufacturing methods, also known as three-dimensional (3D) printing. More specifically, improved 3D printing methods are disclosed for forming custom in-fill patterns of supporting material for parts having a void between surfaces.

2. Description of the Related Art

Existing 3D printer programs typically include basic geometries oriented normal to the build plane for printing in-fill patterns within parts having a void between surfaces.

U.S. Patent Publication 2013/0313743 to Rockhold discloses iterative techniques for in-filling enclosed interior volumes of three-dimensional shapes during an additive fabrication process. However, the process adds build material according to a conventional approach in which material is added in layers along a z-axis perpendicular to an x-y build plane.

U.S. Patent Publication 2016/0019319 to Shtilerman discloses a method for slicing a three-dimensional model for printing an object. However, the slicing is performed per a conventional approach in which the slices are along an axis perpendicular to the printing plane.

U. S. Patent Publication 2016/0159012 to Zucheul et al. discloses a 3D printing resource allocation method, based on a calculated cost and estimated quality, for determining how to slice a 3D model.

U. S. Patent Publication 2014/0257548 to Bachrach et al. discloses a method for identifying locations on two slices of a 3D model for coupling the slices together.

International Patent Publication 2016/081496 to Mark et al. discloses a 3D printing method that includes fill tool paths for anisotropic fill materials.

SUMMARY

In an embodiment, an additive manufacturing method for improved core structure is provided. The method includes providing a computational model of a part having a core portion, determining a custom in-fill pattern for supporting the core portion, slicing the computational model into a predetermined number of slices having a predetermined orientation based on the computational model and the custom in-fill pattern, splitting the computational model into sequentially queued individual model segments based on the predetermined number of slices and their predetermined orientation, and building the part in a plurality of layers applied sequentially. The steps for building an individual layer of the plurality of layers includes providing an individual model segment, generating instructions for the individual model segment, forming the individual part layer based on the individual model segment, and removing the instructions for the individual model segment. The method further includes iteratively repeating the steps for building an individual layer for each of the plurality of layers to form a series of layers stacked adjacent to one another, forming a final part having a core portion supported with a custom in-fill pattern.

In another embodiment, an additive manufacturing system for providing an improved core structure of a part is provided. The system includes a controller having non-transitory memory for storing software, and a processor for executing instructions of the software. The instructions include a solid model of the part having a core structure supported by a custom in-fill pattern, a plurality of individual model segments based on slices of the solid model, the slices having a preferred orientation, and a 3D printer having non-transitory memory for storing printer software, and a printer processor for executing instructions of the printer software. The 3D printer includes a first source of a first material for depositing to form the part, a second source of a second material for depositing to form the custom in-fill pattern, and a nozzle configured for depositing a layer having one or more of the first material and the second material. The 3D printer is communicatively coupled to the controller for receiving into printer memory one model segment from the plurality of individual model segments, depositing the layer based on the one model segment, removing the one model segment from printer memory, receiving a subsequent model segment into printer memory from the plurality of individual model segments, and depositing an adjacent layer based on the subsequent model segment.

In yet another embodiment, a 3D-printed part formed using a 3D printer is provided. The 3D-printed part includes a first exterior surface separated by a gap from a second exterior surface, and an internal core structure within the gap for mechanically connecting the first exterior surface to the second exterior surface. The internal core structure includes a custom in-fill pattern having support members formed of a material, the support members having a thickness, a geometry, a density, and an orientation customized to meet structural requirements of the 3D-printed part independent of a build plane of the 3D printer.

BRIEF DESCRIPTION OF THE DRAWINGS

Illustrative embodiments of the present disclosure are described in detail below with reference to the attached drawing figures, which are incorporated by reference herein and wherein:

FIG. 5 shows a series of internal structural features for a curved part, in an embodiment; and FIG. 6 shows a cross-sectional side view of an annular part having in-fill support structures formed using the method of FIG. 2, in an embodiment.

DETAILED DESCRIPTION

Additive manufacturing methods use a 3D printer to form a part based on a computational model of the part. The 3D printer includes a computer program to further process the computational model for 3D printing. For example, the computational model is digitally "sliced" to represent the part as a series of layered segments, or "slices", oriented along a build plane. The build plane typically has a substantially horizontal orientation. The 3D printer then deposits material one layer at a time according to the modeled slices. The computational model may be a "solid" model, which includes information not only about the part's size and shape, but also about its thickness and material, such that the part's geometry is fully described in 3D space. When digitally slicing the solid model, features of the part that may be important for the 3D printing process are identified. For example, a part having a core region may require physical support within the core during the printing process. As used herein, the term "core" is intended to mean an open portion of a part, although the part does not necessarily form a complete enclosure around the open portion. For example, a part having two surfaces separated by a gap may be described as having two exterior surfaces and an internal core between the two surfaces. In this example, the solid model includes the two surfaces with a void between them, and the 3D printing process adds a standard "in-fill" pattern between the two surfaces for support. In certain embodiments, the in-fill pattern may be formed of a different material than the two surfaces depending on the desired properties of the part.

In-fill patterns of existing 3D printer programs typically include basic and/or fixed geometries such as squares or hexagons, which may be oriented normal to the build plane. Using automatically generated basic geometries oriented normal to the build plane provides low-overhead and efficient computational processing. If custom geometry is desired, it must be incorporated into the solid model, which leads to a prohibitively large computational file that the 3D printer program is unable to process routinely. What is needed is a computationally feasible method that enables in-fill patterns with custom geometries and preferred orientations to provide improved support of the final part, rather than standard geometries oriented with respect to the build plane.

Figure 1:
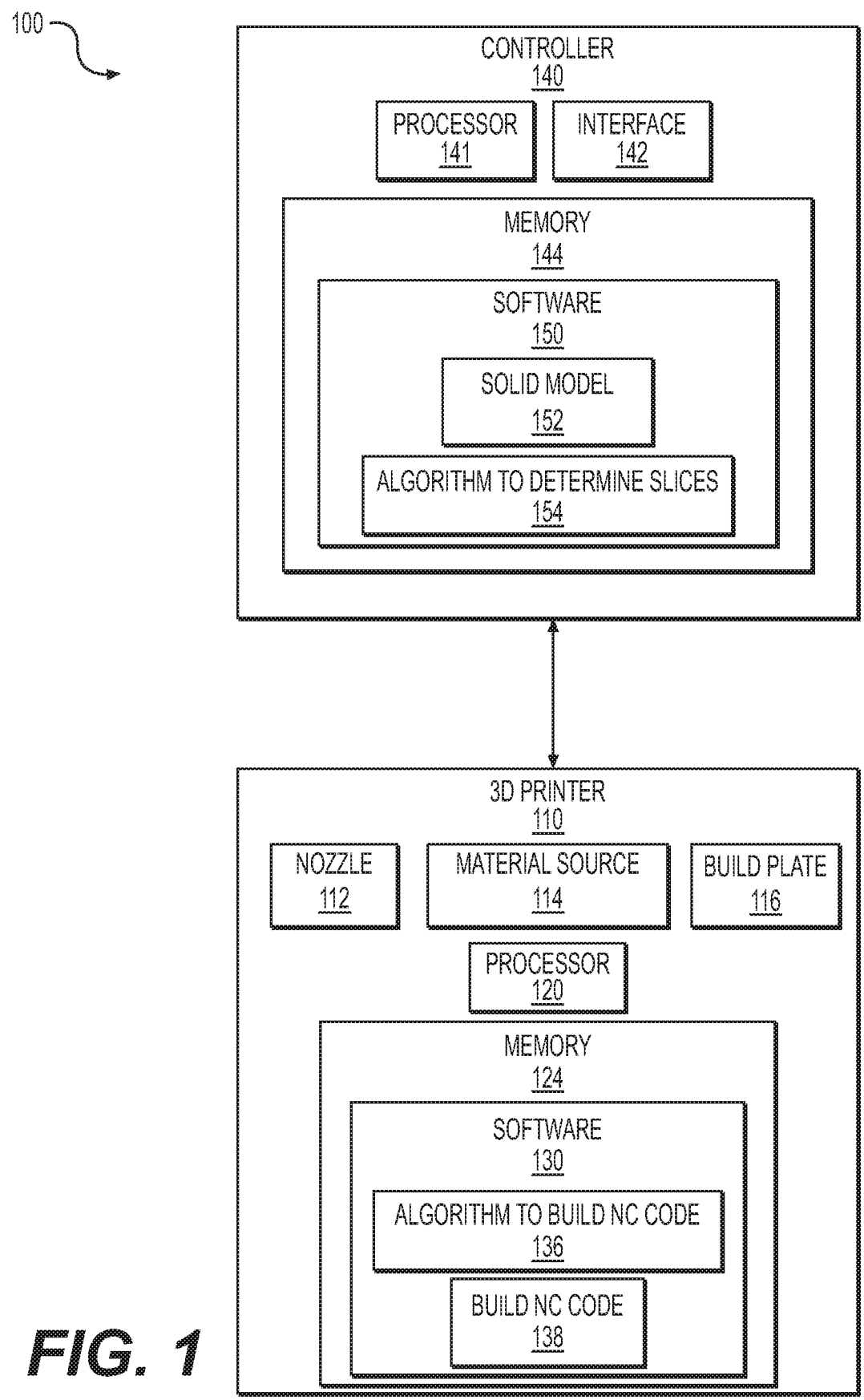
FIG. 1 is a block diagram representing an additive manufacturing system for providing an improved core structure, in an embodiment.

FIG. 1 is a block diagram representing an exemplary additive manufacturing system 100 for providing an optimized core structure. System 100 includes a 3D printer 110 and a controller 140. 3D printer 110 may be any additive manufacturing device capable of forming parts by adding material, including e.g., devices for extrusion deposition and metal sintering. Controller 140 is for example a computer configured to display and analyze a 3D rendering of an object to be manufactured using 3D printer 110.

Controller 140 includes a memory 144, including a non-transitory medium for storing software 150, and a processor 141 for executing machine readable instructions of software 150. Memory 144 in some embodiments is a memory system that includes both transitory memory such as RAM and non-transitory memory such as, ROM, EEPROM, Flash-EEPROM, magnetic media including disk drives, and optical media. Software 150 may include look-up tables, formulas, code, algorithms, and computational models, such as a solid model 152 and an algorithm 154 to determine slices, which are described below.

Solid model 152 is a computational model that provides a 3D rendering of an object, which includes information not only about the part's size and shape, but also about its thickness and material, such that the part's geometry is fully described in 3D space. An interface 142 displays the 3D rendering of solid model 152 and enables a user to input instructions and view additional data about solid model 152.

Algorithm 154 provides instructions for determining a number of slices and an orientation of slices for "slicing" solid model 152. The term slicing, as used herein, refers to the process of digitally dividing a computational model into a plurality of segments or "slices". In certain embodiments, each individual segment may be stored separately in memory 144 for independent transmission to 3D printer 110. The thickness of each slice may depend on a myriad of 3D printing properties, such as the type of material being deposited, the type of nozzle 112 used to deposit the material, and the process by which the material solidifies (e.g., cooling, photo polymerization, etc.). Algorithm 154 is preferably carried out using controller 140, but may optionally be carried out via 3D printer 110.

3D printer 110 includes a nozzle 112 for delivery of material, such as a powder, filament, or molten plastic/metal, a material source 114 fluidly coupled to the nozzle 112 for providing the material, and a build plate 116 for depositing the material upon. Material source 114 may include a spool of filament or a reservoir fluidly coupled with appropriate devices for transferring material to nozzle 112, such as tubes and a pump. In certain embodiments, nozzle 112 includes a plurality of nozzles and material source 114 includes a plurality of sources containing different materials. The different materials may be deposited using a respective one of the different nozzles (e.g., simultaneously), or different materials may be deposited using the same nozzle (e.g., sequentially).

3D printer 110 further includes a memory 124, (which is an example of memory 144) including a non-transitory medium for storing software 130, and a processor 120 for executing machine readable instructions of software. Software 130 may include look-up tables, formulas, code, computational models, and algorithms, such as a build Numeric Control (NC) code 138 and an algorithm 136 to generate build NC code, which are described below. 3D printer 110 may include one or more of a printed circuit board (PCB), a computer, a microcontroller, a microprocessor, or a programmable logic controller (PLC).

Algorithm 136 determines instructions for creating a build NC code 138 based on slices of solid model 152. In certain embodiments, build NC code 138 is determined for individual model segments of the sliced solid model. Following forming of the individual layer, build NC code 138 may be deleted from memory 124 to reduce a computational load on processor 120 and/or memory 124. A subsequent model segment may then be transmitted to memory 124 of 3D-printer for building a subsequent adjacent layer of the 3D-printed part (see method 200, FIG. 2 and its related description below).

Communication between 3D printer 110 and controller 140 may be via a wired and/or wireless communication device. For example, 3D printer 110 and controller 140 may each include a transmitter/receiver, a multi-channel input/output (I/O) data bus, or the like (not shown) for communicatively coupling with one another.

Figure 2:
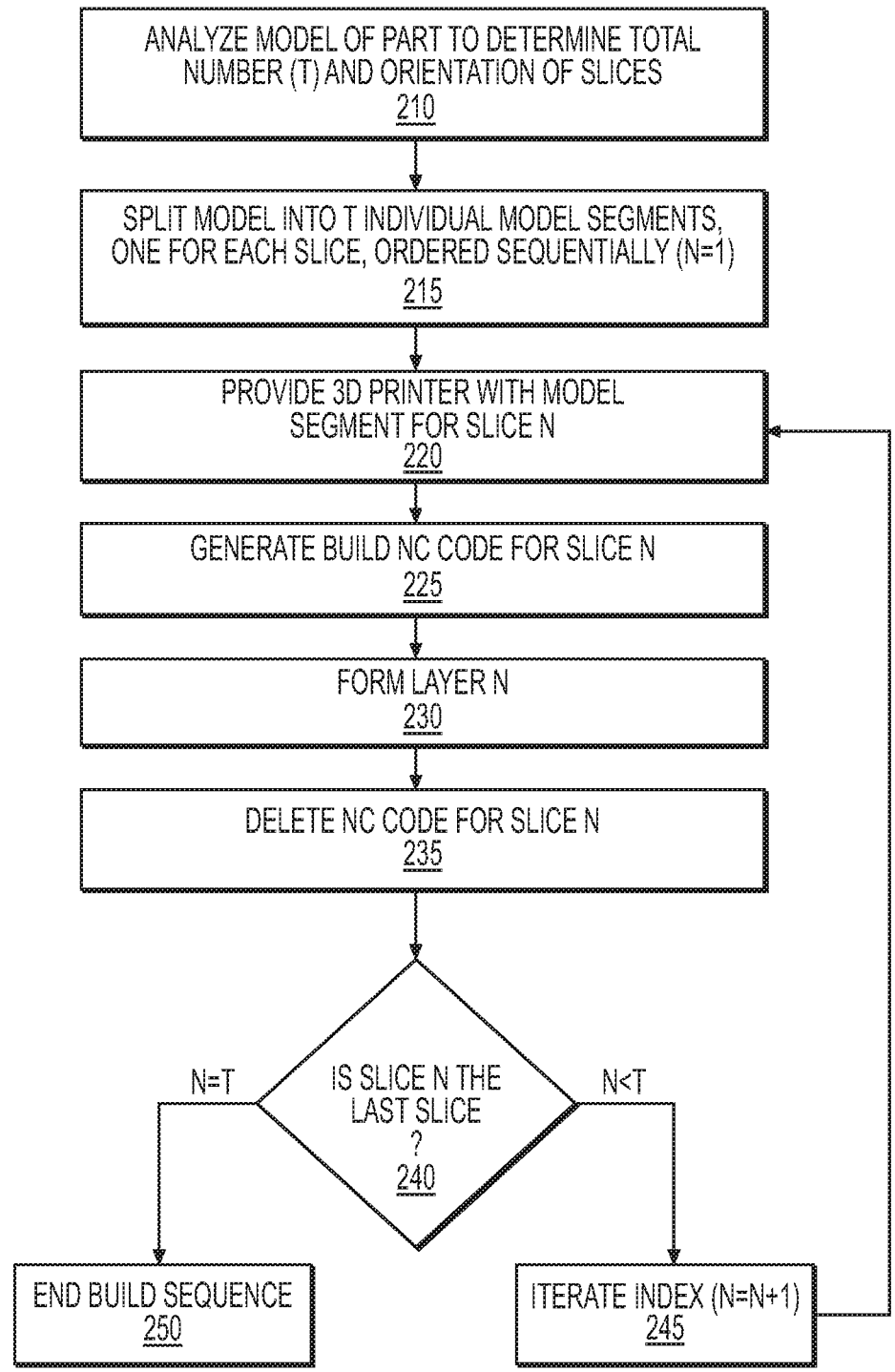
FIG. 2 is a block diagram representing an additive manufacturing method for providing an improved core structure, in an embodiment.
Figure 3:
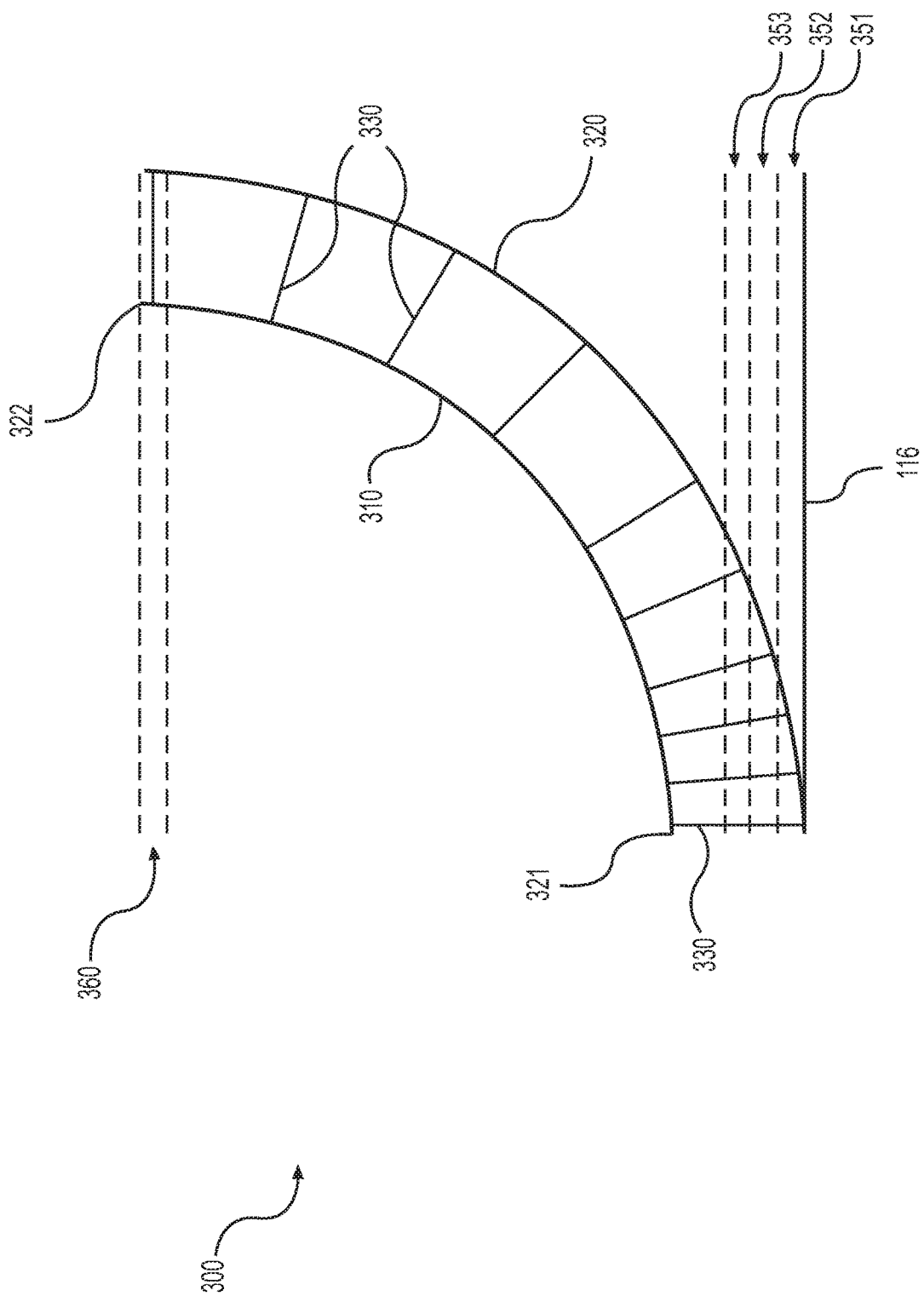
FIG. 3 shows a cross-sectional side view of a curved part having in-fill support structures formed using the method of FIG. 2, in an embodiment.

FIG. 2 is a block diagram representing an exemplary additive manufacturing method 200 for providing an improved core structure. Method 200 may be performed using system 100, FIG. 1, for example. 3D printed parts having two surfaces spaced apart, and which require physical support between the two surfaces, may benefit substantially from method 200. An in-fill pattern that is printed to provide physical support between the two surfaces may be customized (as depicted in FIG. 3) for improved structural properties. However, customizing the in-fill pattern leads to a prohibitively large computational file that a 3D printer may be unable to process. Method 200 provides a computationally feasible method to enable 3D printing of in-fill support structures having custom spacing, orientation, and geometry. The resulting in-fill support is customized for the expected function and operating conditions of the part.

For example, curved parts, such as grown cantilever structures and engine beams and mounts, may be improved with optimized in-fill patterns. A curved part that experiences aerodynamic forces applied normal to a curved surface (e.g., a winglet) may be in-filled with support members that are oriented normal to the curved surface, thereby providing superior structural support. Parts having variable properties along a direction, such as cantilever supports, may be improved with optimized in-fill patterns. For example, a wing section may be in-filled with support members having a geometry and density that varies with a thickness of the wing section (e.g., as a thickness of the wing tapers towards its tip and/or its trailing edge). In another example, a geometry and density of support members may be customized based on a sweep of a wing. Optimized in-fill patterns may be used to engineer compliance and drive failures to a specific region of a part. A structure that will experience shear forces along a substantially planar surface (e.g., a wing section) may be in-filled with support members that are angled with respect to the surface based on the direction of shear forces (e.g., the direction of airflow over the wing section). These exemplary custom support members are oriented to provide improved support to the final part for its intended use, without adding unnecessary weight, which is lacking when standard geometries oriented with respect to the build plane are used. The in-fill pattern may be formed of a second material that is different than the surface material. The material, thickness, geometry, density, and orientation of the support members is based on structural requirements of the final part during its intended use (e.g., bending moments due to aerodynamic forces).

In a step 210, a model of the part is analyzed to determine a total number and orientation of slices. In an example of step 210, controller 140 uses algorithm 154 to analyze solid model 152 to determine the total number of slices, T, and an optimal orientation of the slices. Algorithm 154 may queue the slices of solid model 152 in such a way as to prevent the corresponding layers from needing cold-bonding to secure one layer to the next.

In a step 215, the model is split into individual model segments based on the slices determined in step 210. In an example of step 215, controller 140 uses algorithm 154 to generate T number of individual model segments, each corresponding to an individual slice. From a computational perspective, each slice is considered like an individual part. In other words, each individual model segment is a separate solid model.

The individual model segments are ordered sequentially based on the orientation of the slices, such that the bottom slice is first (N=1), the second slice (N=2) is adjacent to the first slice in the build direction, and so on for N=T slices. In general, the first slice is typically on the bottom with subsequent slices sequentially layered on top of one another. In this manner, when the slices are printed to form layers, the first layer is formed on build plate 116 and adjacent layers are subsequently formed sequentially on top of one another.

In a step 220, the 3D printer is provided with an individual model segment corresponding to slice N. In an example of step 220, controller 140 transmits the individual model segment corresponding to slice N to memory 124 of 3D printer 110.

In a step 225, the build NC code for slice N is generated. In an example of step 225, 3D printer 110 uses algorithm 136 to generate build NC code 138 for layer N based on the individual model segment corresponding to slice N. Build NC code 138, which is stored as part of software 130 in memory 124, may include a series of commands for operating 3D printer 110. For example, build NC code 138 may include a series of commands for supplying material from material source 114 to nozzle 112, positioning nozzle 112 with respect to build plate 116, rotating and/or translating build plate 116, and releasing material from nozzle 112 to form layer N.

In a step 230, layer N is formed. In an example of step 230, 3D printer 110 deposits material via nozzle 112 to form layer N based on build NC code 138. Layer N may include more than one type of material, which may be specified via solid model 152. For example, certain portions of layer N may include a structural material, while other portions of layer N may include in-fill material to provide in-fill support structure. Layer N may be deposited using a single nozzle with a plurality of passes to accommodate a plurality of materials. In certain embodiments, 3D printer 110 includes more than one nozzle for depositing more than one type of material, which may be performed simultaneously or sequentially.

In a step 235, the NC code is deleted for slice N. In an example of step 235, build NC code 138 for slice N is deleted from memory 124. This reduces the required computational load (e.g., on memory 124 and/or processor 120), thereby preventing the NC code from becoming prohibitively large for 3D printer 110 to handle expediently.

A step 240, is a decision. If in step 240, slice N is determined to be the last slice (e.g., N=T), method 200 proceeds with step 250 to end the build sequence. Otherwise, if slice N is not determined to be the last slice (e.g., N<T), method 200 proceeds with step 245 to iterate the index (e.g., N=N+1). Following step 245, method 200 returns to step 220 to provide the 3D printer with the model for the next slice. Steps 220 through 245 are repeated until all slices of the original model are printed as layers (e.g., N=T).

Method 200 enables printing of sandwich structures (e.g., having outer panels and an inner core) that have complex patterns of in-fill support structure. The method is not limited to plastic and composite laminate structures but is also applicable to metal and hybrid structures as well.

Advantages of custom in-fill patterns include an ability to orient the in-fill support material with respect to a surface of the part as opposed to being oriented normal to the build plane. For example, a curved part may include support features oriented normal to load surfaces, as depicted in FIG. 3, providing advantages such as increased strength and decreased weight.

FIG. 3 shows a cross-sectional side view of a curved part 300 with a top surface 310 and a bottom surface 320. The top surface 310 includes a first end 321 and a second end 322. A plurality of support members 330 are provided within the core region of curved part 300 that mechanically couple top surface 310 with bottom surface 320. Not all support members 330 are labeled in FIG. 3 for clarity of illustration.

Additive manufacturing of curved part 300 may be performed using method 200, FIG. 2. First, solid model 152 corresponding to part 300 is analyzed to determine a total number (T) and orientation of slices (e.g., in step 210, FIG. 2). For the example shown in FIG. 3, the model is sliced into a plurality of slices (depicted with dashed lines) that are oriented with respect to a build plane parallel with build plate 116, beginning with a first slice 351, a second slice 352, a third slice 353, and so on up to a last slice 360. Not all slices are shown for clarity of illustration. Each subsequent slice is immediately adjacent to the previous slice in a direction perpendicular to the build plane and further away from build plate 116. Next, the 3D model of part 300 is split into individual models corresponding to the slices of the original model (e.g., in step 215, FIG. 2). The individual models are sequentially ordered and queued for printing. For example, the models are sequentially numbered (N) with N=1 for first slice 351, N=2 for second slice 352, N=3 for third slice 353, and so on up to a N=T for last slice 360. Next, the first individual model, corresponding to first slice 351, is transmitted from controller 140 to 3D printer 110 (e.g., in step 220, FIG. 3). 3D printer 110 then generates the NC code for slice N (step 225), forms layer N (step 230), and deletes the NC code for slice N (step 235). At this point, the index is iterated such that N=N+1 (step 245) and steps 220 to 235 are repeated for the next slice (N=2). This cycle is repeated until the last layer (N=T) is printed and the build sequence ends (step 250).

In the example of FIG. 3, support members 330 are oriented normal to top and bottom surfaces 310, 320 as opposed to being oriented with respect to build plate 116, even though support members 330 are deposited sequentially in layers (e.g., 351, 352, 353, . . . 360) oriented with respect to build plate 116. Another important difference from traditional 3D printing methods is that method 200 enables varied density of structural features. For example, as depicted in FIG. 3, support members 330 are spaced closer together near a first end 321 compared to near a second end 332. This may be important for providing rigidity near first end 321, such as a situation where first end 321 is mounted to another structure.

The thickness, orientation, and density of support members 330 is not limited to those depicted in FIG. 3. Support members 330 may include any structural feature for providing physical support between top surface 310 and bottom surface 320 as well as features between support members 330. For example, support members 330 may include structural features that mechanically couple top surface 310 with bottom surface 320, as well as additional structural features (not shown) that mechanically interconnect the depicted support members 330. The thickness, orientation, and density of support members 330 may vary along a depth of curved part 300. Therefore, a traditional in-fill pattern having basic geometries oriented normal to the build plane would not be able to accommodate support members 330 even if curved part 300 were rotated with respect to build plate 116.

Figure 4:
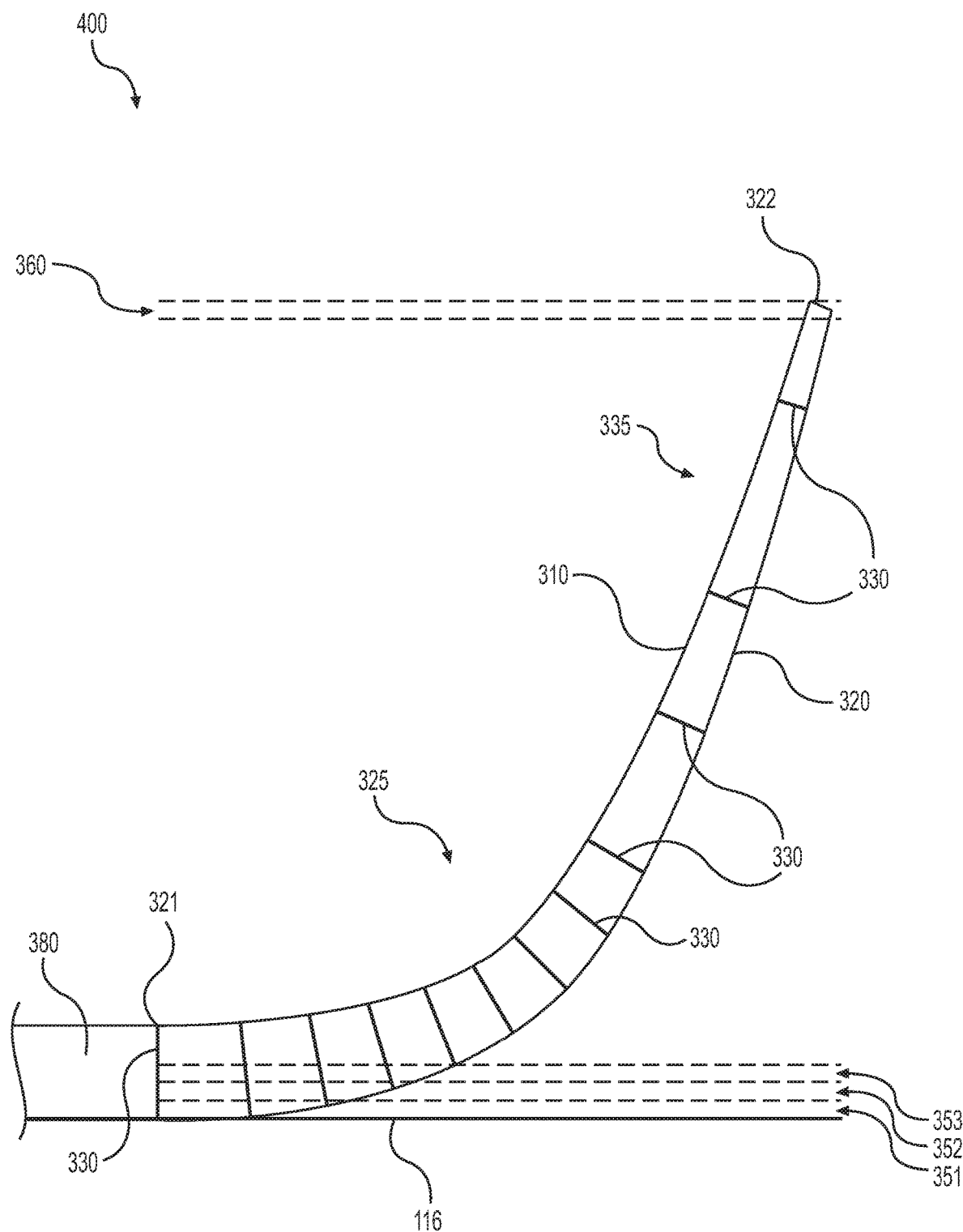
FIG. 4 shows a cross-sectional side view of a winglet having in-fill support structures formed using the method of FIG. 2, in an embodiment.

FIG. 4 shows a cross-sectional side view of a winglet 400, which is an example of curved part 300, FIG. 3 formed via additive manufacturing method 200, FIG. 2. Winglet 400 includes top surface 310 and bottom surface 320, which are for example composite laminate skins forming a top and bottom surface of winglet 400, respectively. At first end 321, winglet 400 is mechanically coupled to an outboard end of wing 380. Winglet 400 forms an extension of wing 380 that extends upwardly and outwardly.

Winglets, which attach to the end of an aircraft wing, experience aerodynamic forces and bending moments that may require non-uniform stiffness and strength throughout the length of the winglet, which may be provided by printing custom support structures with an orientation and density optimized for these aerodynamic forces and bending moments.

In certain embodiments, aerodynamic forces on the wing and winglet may create bending moments that require additional support members 330 near first end 321 and/or near the bend portion of winglet 400. For example, a density of support members 330 may be based on a radius of curvature of the top surface 310 and/or the bottom surface 320. As depicted in FIG. 4, a higher density of support members 330 are provided in the portion of winglet 400 indicated generally by an arrow 325 having the tightest curve (e.g., the portion having the smallest radius of curvature). In contrast, a lower density of support members 330 are provided in the flattest portion of winglet 400 indicated generally by an arrow 335 (e.g., the portion having the highest radius of curvature).

FIG. 5 shows a side view of an exemplary in-fill pattern 500 for improved core structure. The in-fill pattern includes a series of support members 530 that are oriented normal to a curved plane. Support members 530 are configured to support top and bottom surfaces, which are not shown for clarity of illustration. Note that only one layer of support members 530 are depicted in FIG. 5, but a plurality of layers may be aligned adjacent to one another, or in a staggered pattern, along the depth of the part. Arrows 571, 572, 573, 574, 575, and 576 illustrate directions normal to the curved plane that a load is expected to be applied to the part. The structural features are aligned normal to the load for optimized support. Deposition layers 351, 352, 353, . . . 360 on top of build plate are the same as for FIG. 3. The expected load may be in an alternate direction, such as those caused by shear forces, and the orientation of support members 530 may be shaped and angled accordingly.

Geometries of in-fill patterns may be adopted that vary with respect to the build plane of the 3D printer, and which may vary within different portions of an internal core. For example, if a top and bottom surface converge to a tip, such that a height of the internal core between the surfaces varies, the geometries of interconnecting support members may be varied accordingly. For an aircraft wing, thicker portions of the wing section (e.g., adjacent the fuselage or leading edge) may include traditional stringers and ribs oriented in a rectangular-grid pattern, while narrower portions of the wing section (e.g., adjacent the wing tip or trailing edge) may include a more complex pattern lacking traditional stringers and ribs. 3D printing enables production of complex in-fill patterns, which may include, but are not limited to, circular, triangular, hexagonal, and honeycomb patterns.

FIG. 6 shows a cross-sectional side view of an annular part 600 with an inner surface 610 and an outer surface 620. Annular part 600 is an example of curved part 300 having a plurality of support members 330 for providing structural support within a core region between inner surface 610 and outer surface 620. Not all support members 330 are labeled in FIG. 6 for clarity of illustration.

Additive manufacturing of curved part 600 may be performed using method 200, FIG. 2. Support members 330 are oriented normal to inner and outer surfaces 610, 620 as opposed to being oriented with respect to build plate 116, even though support members 630 are deposited sequentially in layers (e.g., 351, 352, 353, ... 360) oriented with respect to build plate 116. Additional structural features (not shown) may interconnect the depicted support members 330, and a thickness, orientation, and density of support members 330 may vary along a depth of annular part 600. Therefore, a traditional in-fill pattern having basic geometries oriented normal to the build plane would not be able to accommodate support members 330 even if annular part 600 were rotated with respect to build plate 116.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all operations listed in the various figures need be carried out in the specific order described.

We claim:

1. An additive manufacturing method, comprising:
   providing a computational model of a part to a controller, wherein the part includes a core portion supported by an in-fill pattern of material;
   wherein the controller is programmed to perform the steps of:
      determining an in-fill pattern for supporting the core portion;
      slicing the computational model into a predetermined number of slices having a predetermined orientation;
      splitting the computational model into sequentially queued individual model segments according to the predetermined number of slices;
      providing an individual model segment to a 3D printer; and
   wherein the 3D printer is programmed to form the part in a plurality of layers applied sequentially by performing the steps of:
      receiving the individual model segment from the controller;
      generating instructions for the individual model segment;
      forming an individual part layer according to the individual model segment;
      removing the instructions and the individual model segment from the 3D printer; and
      repeating the steps of receiving the individual model segment, generating instructions, forming the individual part layer, and removing the instructions to form a series of layers stacked on one another until a final part having a core portion supported with the in-fill pattern of material has been formed.

2. The additive manufacturing method of claim 1, wherein determining the in-fill pattern for supporting the core portion is determined according to an expected force applied to the part during its intended use.

3. The additive manufacturing method of claim 1, wherein determining the in-fill pattern for supporting the core portion comprises determining a thickness, a geometry, a density, and an orientation of structural supports that form the in-fill pattern.

4. The additive manufacturing method of claim 1, wherein slicing the computational model into the predetermined number of slices is performed according to one or more of a type of material used in building the part, a type of nozzle used to deposit the material, and a process by which the material solidifies.

5. The additive manufacturing method of claim 1, wherein generating the instructions for the individual model segment comprises generating build numeric control (NC) code configured to provide commands to operate a 3D printer.

6. The additive manufacturing method of claim 1, wherein forming an individual part layer further comprises depositing at least one material in a layer using a nozzle.

7. The additive manufacturing method of claim 5, wherein removing the instructions for the individual model segment further comprises deleting the build NC code from a memory of the 3D printer to reduce a computational load.

8. An additive manufacturing system, comprising:
   a computational model of a part stored in a first non-transitory memory of a controller, wherein the part includes a core portion configured to be supported by an in-fill pattern of material;
   the controller having a first processor, wherein the first processor executes first instructions stored in the first non-transitory memory, the first instructions being programmed to:
      a) determine a configuration of the in-fill pattern for supporting the core portion;
      b) slice the computational model into a predetermined number of slices having a predetermined orientation;
      c) split the computational model into a plurality of individual model segments according to the predetermined number of slices; and
      d) provide the plurality of individual model segments one at a time in a sequential order to a 3D printer; and
   a 3D printer having a second processor and a second non-transitory memory, wherein the second processor executes second instructions stored in the second non-transitory memory, the second instructions being programmed to:
      e) receive an individual model segment from the controller;
      f) generate commands for forming the individual model segment;
      g) form an individual part layer according to the commands;
      h) remove the command and the individual model segment from the 3D printer; and
      i) repeats steps e-h for subsequent individual model segments until a final part having a core portion supported with the in-fill pattern of material has been formed.

9. The additive manufacturing system of claim 8, wherein the core portion of the part is formed between a first surface and a second surface, and the core portion is supported by the in-fill pattern of material.

10. The additive manufacturing system of claim 8, wherein the 3D printer includes a build plate for depositing the layer and the in-fill pattern is oriented independently of the build plate.

11. The additive manufacturing system of claim 10, wherein the in-dill pattern is oriented according to an expected force applied to the part during its intended use.

12. The additive manufacturing system of claim 8, wherein depositing the layer according to the individual model segment comprises determining instructions for creating a build numeric control (NC) code for the 3D printer according to the individual model segment.

13. The additive manufacturing system of claim 12, wherein removing the individual model segment from printer memory further includes removing the build (NC) code corresponding to the individual model segment for a most recently deposited layer.

14. The additive manufacturing system of claim 8, wherein the core portion of the part fills a gap between the first surface and the second surface, and the in-fill pattern comprises support members formed of a material, the support members having a thickness, a geometry, a density, and an orientation configured to meet structural requirements of the part independent of a build plane of the 3D printer.

15. The additive manufacturing system of claim 14, wherein a width of the gap between the first surface and the second surface varies within the part, and the in-fill pattern varies according to the width of the gap.

16. The additive manufacturing system of claim 14, wherein one or more of the material, the thickness, the geometry, the density, and the orientation of the support members are configured to provide increase strength and decreased weight of the part.

17. The additive manufacturing system of claim 14, wherein the first surface forms a substantially planar surface and the in-fill pattern includes support members oriented at an angle according to an expected direction and magnitude of shear forces applied to the substantially planar surface.

18. The additive manufacturing system of claim 14, wherein the first surface has a curved shape and the material, the thickness, the geometry, the density, and the orientation of the support members are configured to meet structural requirements according to an expected bending moment applied to the part during its intended use.

19. The additive manufacturing system of claim 18, wherein angles of the support members varies with respect to the build plane of the 3D printer according to the curvature of the curved shape.

20. The additive manufacturing system of claim 18, wherein a density of the support members varies within the in-fill pattern according to a radius of curvature of the curved shape.

* * * * *